(12) United States Patent
Gallagher

(10) Patent No.: US 8,263,316 B2
(45) Date of Patent: Sep. 11, 2012

(54) ELECTRONIC DEVICE MANUFACTURE

(75) Inventor: Michael K. Gallagher, Hopkinton, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 1646 days.

(21) Appl. No.: 11/242,362

(22) Filed: Oct. 3, 2005

(65) Prior Publication Data

US 2006/0073423 A1    Apr. 6, 2006

Related U.S. Application Data

(60) Provisional application No. 60/615,317, filed on Oct. 1, 2004.

(51) Int. Cl.
*G03F 7/26* (2006.01)
(52) U.S. Cl. ........................................ 430/315
(58) Field of Classification Search .............. 430/311, 430/324, 330, 312, 315, 320
See application file for complete search history.

(56) References Cited

U.S. PATENT DOCUMENTS

| | | | |
|---|---|---|---|
| 5,869,880 A | 2/1999 | Grill et al. | |
| 5,923,074 A | 7/1999 | Jeng | |
| 6,017,814 A | 1/2000 | Grill et al. | |
| 6,165,890 A | 12/2000 | Kohl et al. | |
| 6,420,441 B1 * | 7/2002 | Allen et al. | ........... 521/77 |
| 6,562,732 B2 | 5/2003 | Besling et al. | |
| 6,610,593 B2 | 8/2003 | Kohl et al. | |
| 6,627,534 B1 | 9/2003 | Lee | |
| 6,693,355 B1 | 2/2004 | Grove | |
| 6,734,094 B2 | 5/2004 | Kloster et al. | |
| 2004/0102031 A1 | 5/2004 | Kloster et al. | |
| 2004/0137728 A1 | 7/2004 | Gallagher et al. | |

FOREIGN PATENT DOCUMENTS

WO  WO 2004/105122 A1  12/2004

* cited by examiner

*Primary Examiner* — Kathleen Duda
*Assistant Examiner* — Caleen Sullivan
(74) *Attorney, Agent, or Firm* — Jonathan D. Baskin

(57) ABSTRACT

Electronic devices having a metal line-containing layer including an air gap region and a low-k dielectric material region where the air gap region includes a dense packing of metal lines is provided. Methods of forming such electronic devices are also provided.

5 Claims, 6 Drawing Sheets

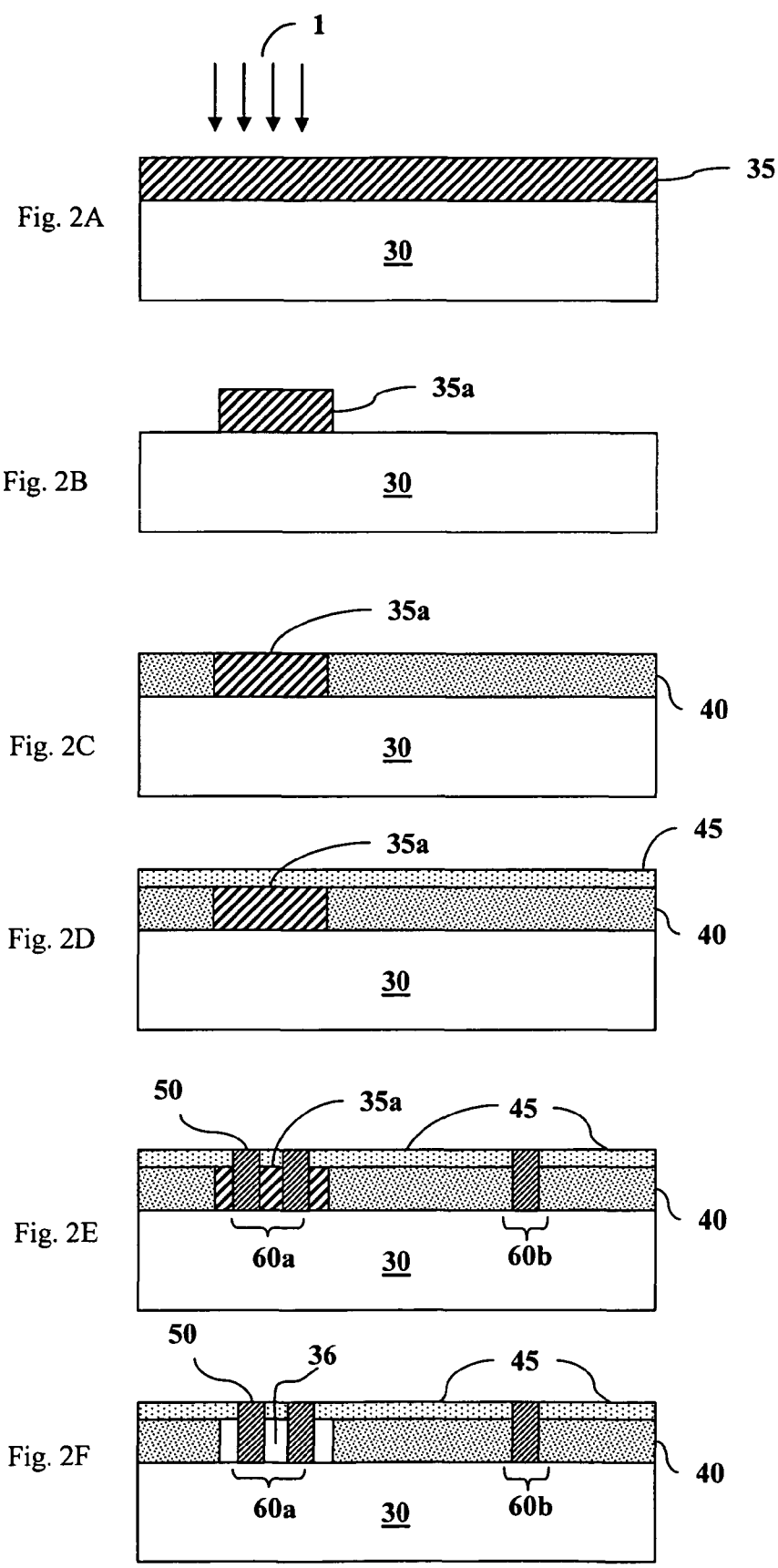

ELECTRONIC DEVICE MANUFACTURE

BACKGROUND OF THE INVENTION

The present invention relates generally to the field of electronic device manufacture. More particularly, the present invention relates to the manufacture of integrated circuits using air gaps to reduce capacitive coupling between conductors in such devices.

Advances in integrated circuit technology have reduced the spacing between the metal lines on any given plane of an integrated circuit. Such reduced spacing between metal lines results in an increase in capacitive coupling between nearby conductive traces causing problems such as greater cross-talk and higher capacitive losses.

Low dielectric constant ("low-k") materials (typically having dielectric constants of approximately 1.8 to 2.5) are being developed as a replacement for conventional dielectric materials used between conductors on a given layer and between layers. These low-k materials reduce capacitive coupling between the conductors as compared to conventional dielectric materials. However, low-k materials have not been used in all applications as they can possess severe processing, cost and materials problems.

The lowest possible, or ideal, dielectric constant is 1.0, which is the dielectric constant of a vacuum. Air is almost as good with a dielectric constant of 1.001. Attempts have been made to fabricate semiconductor devices with air gaps between metal lines to reduce the capacitive coupling between the electrically conducting members. The air gap forming techniques that have been developed have varying degrees of complexity but typically employ a material disposed between metal lines that is subsequently removed to provide an air gap. However, these techniques are not without problems.

U.S. Pat. No. 6,693,355 (Grove) discloses the use of a photosensitive material to form an air gap. According to this patent, a layer of photosensitive material is disposed on a substrate. A portion of the photosensitive material is then exposed to light to change the cross-link characteristics of the material. For example, when the photosensitive material is a positive tone material, exposure to light breaks the cross-links present in the material. A permeable second layer is then applied on the layer of photosensitive material. The exposed photosensitive material is then removed through the permeable second layer providing air gaps where the exposed photosensitive material was present. Unexposed photosensitive material (in the case of a positive tone photosensitive material) remains on the substrate under the permeable layer.

This approach presents problems when used with spin-on techniques. For example, the breaking of cross-links in the photosensitive material generally increases the solubility of the photosensitive material in most solvents used in spin-coating applications. Accordingly, if a permeable second material layer is applied by spin-coating, the solvent used for the second material layer will remove all or a part of the exposed photosensitive material. Alternatively, intermixing may occur between the uncross-linked photosensitive material and the second material layer resulting in a blending of the material. Yet another problem arises if the photosensitive material remaining on the substrate has a high dielectric constant as the effective dielectric constant of the total dielectric stack will be increased.

There is a continuing need for air gap forming materials and methods that can be easily applied to a substrate, that can be removed leaving little to no residue, and that can be used with spin-coating techniques.

SUMMARY OF THE INVENTION

The present invention provides a method of forming an air gap in an electronic device including the steps of: a) disposing a layer of a sacrificial material on a substrate, wherein the sacrificial material is photodefineable; b) photodefining the sacrificial material to provide a first region and a second region, the regions having different solubility; c) removing one of the first and second regions to expose areas of the substrate; d) disposing an overlayer material on the remaining region of sacrificial material; and then e) removing the remaining region of sacrificial material through the overlayer material to form an air gap; wherein the sacrificial material includes a cross-linked polymer.

Also provided by the present invention is an electronic device including a substrate, a metal line-containing layer including an air gap region and a low-k dielectric material region, and a permeable overlayer disposed on the metal line-containing layer, wherein the metal line-containing layer includes a dense packing of metal lines within the air gap region.

BRIEF DESCRIPTION OF THE DRAWINGS

The following figures illustrate various aspects of the invention, not to scale. Like reference numerals refer to similar elements.

FIGS. 2A-2F illustrate another embodiment of air gap formation according to the invention.

DETAILED DESCRIPTION OF THE INVENTION

Figure 1A:
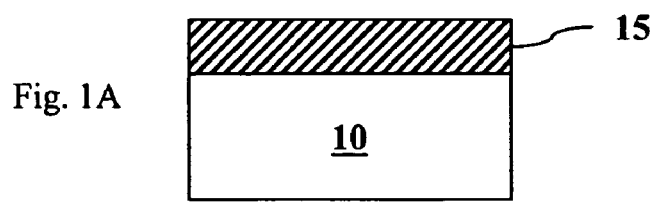
FIGS. 1A-1E illustrate one embodiment of air gap formation according to the invention.

As used throughout this specification, the following abbreviations shall have the following meanings, unless the context clearly indicates otherwise: ° C.=degrees centigrade; μm=micrometer; UV=ultraviolet; nm=nanometer; and % wt=% by weight.

The term "porogen" refers to any removable material added to a dielectric material as a pore forming material, that is a material such as polymeric particles dispersed in a dielectric material that is subsequently removed to yield pores in the dielectric material. The term "pore" refers to voids formed in the dielectric material. "Low-k dielectric material" refers to any dielectric material having a dielectric constant of ≦3. An "air gap" refers to an closed interior volume containing air (or vacuum) within an electronic device but does not include a "pore". As used throughout the specification, "feature" refers to the geometries on a substrate. "Apertures" refer to recessed features, such as vias and trenches.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "polymer" includes both homopolymers and copolymers. The terms "oligomer" and "oligomeric" include dimers, trimers, and tetramers. "Monomer" refers to any ethylenically or acetylenically unsaturated compound capable of being polymerized. Such monomers may contain one or more double or triple bonds. "Cross-linker" and "cross-linking agent" are used interchangeably throughout this specification and refer to a compound having two or more groups capable of being polymerized. As used herein, the terms "cure" and "curing" refer to polymerization, condensation or any other reaction where the molecular weight of a compound is increased. The step of solvent removal alone is not considered "curing" as used in this specification. However, a step involving both solvent removal and increasing the molecular weight of a compound is within the term "curing" as used herein. "Halogen" refers to fluorine, chlorine, bromine and iodine.

The articles "a" and "an" refer to the singular and the plural. Unless otherwise noted, all amounts are percent by weight and all ratios are by weight. All numerical ranges are inclusive and combinable in any order, except where it is clear that such numerical ranges are constrained to add up to 100%.

The present invention provides both an air gap region and a low-k dielectric material region, such as a porous low-k dielectric material region, within the same layer (or level) of an electronic device. Such regions can be achieved within the same level using spin-on techniques. The low-k dielectric material can also serve as a cap layer over the air gap structures, the cap layer being sufficiently permeable to allow for removal of the air gap-forming material through the cap layer. An advantage of the present invention is that air gaps can be confined to regions of a level containing a dense packing of conductive lines where very low dielectric constants are needed while allowing for the use of low-k dielectric material in areas of the level that do not contain such a dense packing of conductive lines.

The present invention allows for electronic devices containing a dielectric material in an air gap-containing level that is similar to dielectric material used in levels that do not contain an air gap. The use of similar dielectric materials reduces the problem of coefficient of thermal expansion mismatch. Air gaps themselves provide no support to the levels above and therefore the region containing an air gap must be minimized within a device structure for mechanical integrity. An advantage of the present invention is that the mechanical integrity of an air gap-containing level is improved compared to conventional air gap forming processes as the air gaps can be confined to regions having densely packed metal lines. Typically, the maximum air gap between metal lines should be less than or equal to 10 µm, and more typically less than or equal to 1 µm. According to the present invention, a higher dielectric constant material than air is provided in all other regions (i.e., non-air gap-containing regions) of the electronic device which leads to a structure having improved mechanical integrity as compared to conventional air gap-containing structures.

FIGS. 1A-1E illustrate a general process of the present invention using a sacrificial material to form air gaps in electronic, optoelectronic and optical devices. Referring to FIG. 1A, a sacrificial material 15 is disposed on a substrate 10. The sacrificial material is then patterned to provide a first region and a second region, the regions having differing solubility. The sacrificial material may be patterned using conventional lithographic techniques, including disposing a photoresist on the sacrificial material, exposing the photoresist to patterned actinic radiation, developing the photoresist and removing the unwanted sacrificial material and then removing the photoresist from the sacrificial material. In one embodiment, the sacrificial material is photodefineable. Such photodefineable sacrificial material may be either positive or negative tone. The photodefineable sacrificial material may be defined (i.e. patterned) by exposure to appropriate actinic radiation through a mask.

Figure 1B:
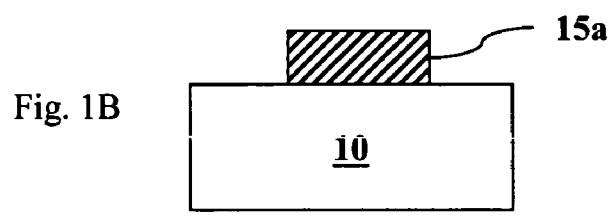
Figure 1C:
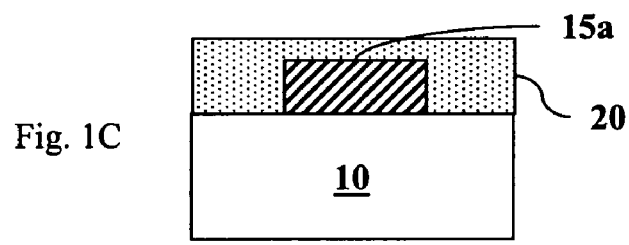

One of the first and second regions is then removed. In the case of a positive tone sacrificial material, the region exposed to actinic radiation is removed and in the case of a negative tone sacrificial material, the region not exposed to actinic radiation is removed. FIG. 1B illustrates a substrate 10 containing a first sacrificial material region 15a. Dielectric material 20 (overlayer) is then disposed on sacrificial material region 15a and on exposed areas of substrate 10, as shown in FIG. 1C. Dielectric is material 20 is sufficiently permeable to allow the sacrificial material to be removed through it. Alternatively, dielectric material 20 becomes sufficiently permeable prior to removal of the sacrificial material.

Figure 1D:
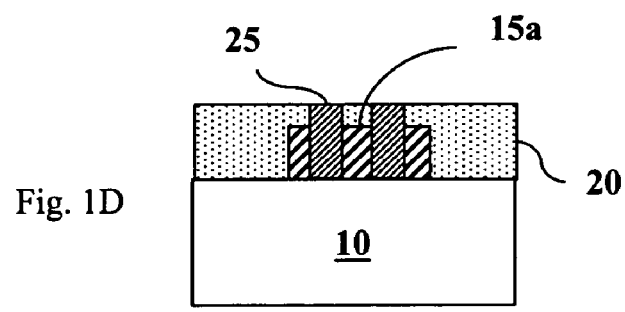
Figure 1E:
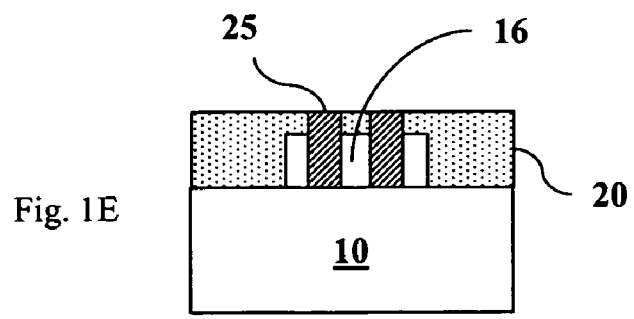

The dielectric material 20 and the sacrificial material region 15a are then patterned using conventional techniques, not shown. Such techniques may include conventional lithographic techniques known to those skilled in the art, such as disposing a photoresist on the dielectric material, optionally disposing an antireflective coating between the dielectric material and the photoresist, patterning the photoresist, transferring the pattern into the dielectric material and the sacrificial material region such as by reactive ion etching to provide apertures and then removing the photoresist and any optional antireflective coating. A conductive material 25, typically a metal, is deposited in the apertures as shown in FIG. 1D. Next, the sacrificial material region 15a is removed to provide air gaps 16, as illustrated in FIG. 1E.

Substrates may be any substrate used at any step in the manufacture of electronic, optoelectronic or optical devices. The substrates may include active or passive devices and may include conductive traces such as metal lines. Also, the substrates may include one or more layers containing air gaps, one or more dielectric material layers or both air gap containing layers and dielectric material layers. In one embodiment, the substrate may include one or more sacrificial material regions. In a further embodiment, the substrate is any substrate used in the manufacture of integrated circuits.

The sacrificial material may be any suitable cross-linked polymer. Exemplary cross-linked polymers include, without limitation, polymers containing as polymerized units one or more monomers of (meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and one or more cross-linking agents. Particularly suitable polymers include as polymerized units one or more (meth)acrylate monomers, (meth)acrylamide monomers or both. Such polymers may include one or more other monomers as polymerized units, such as those described above. (Meth)acrylate monomers include alkyl (meth)acrylates, alkenyl (meth)acrylates, and aromatic (meth)acrylates. (Meth)acrylamide monomers include (meth)acrylamide and alkyl (meth)acrylamides. Typically, the alkyl (meth)acrylates are $(C_1-C_{24})$ alkyl (meth)acrylates. Exemplary alkyl (meth)acrylate monomers include, without limitation: methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate, 2-ethylhexyl acrylate, 2-ethylhexyl methacrylate, octyl methacrylate, decyl methacrylate, isodecyl methacrylate, undecyl methacrylate, dodecyl methacrylate, tridecyl methacrylate, tetradecyl methacrylate, pentadecyl methacrylate, and mixtures thereof. The alkyl (meth)acrylate monomers are generally commercially available or may be prepared by standard esterification procedures using long chain aliphatic alcohols. In one embodiment, the sacrificial material film includes as polymerized units one or more methacrylate monomers. Such methacrylate monomers may be present in the sacrificial material as a mono-functional monomer, a cross-linking agent or both.

Alkyl (meth)acrylate monomers where the alkyl group contains one or more substituent groups may be used. Exemplary substituted alkyl (meth)acrylate monomers include, but are not limited to, hydroxyalkyl (meth)acrylate monomers, dialkylaminoalkyl (meth)acrylate monomers, alkylaminoalkyl (meth)acrylate monomers, and aminoalkyl (meth)acrylate monomers.

The vinyl aromatic monomers useful in the present invention include, without limitation: styrene, hydroxystyrene, α-methylstyrene, p-methylstyrene, ethylvinylbenzene, vinylnaphthalene, vinylxylenes, and mixtures thereof. The vinylaromatic monomers may be substituted, such as with one or more of halogens, nitro, cyano, ($C_1$-$C_{10}$)alkoxy, halo($C_1$-$C_{10}$)alkyl, carb($C_1$-$C_{10}$)alkoxy, carboxy, amino, and ($C_1$-$C_{10}$)alkylamino.

The nitrogen-containing compounds and their thio-analogs useful in the present invention include, but are not limited to: vinylpyridines; ($C_1$-$C_8$)alkyl substituted N-vinyl pyridines; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinylether; ethyl-2-cyano acrylate; vinyl acetonitrile; N-vinylphthalimide; N-vinyl-pyrrolidones; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate and vinyl ethers.

In addition, the present polymers may include as polymerized units one or more poly(alkylene oxide) monomers. Suitable poly(alkylene oxide) monomers include, but are not limited to, poly(propylene oxide) monomers, poly(ethylene oxide) monomers, poly(ethylene oxide/propylene oxide) monomers, poly(propylene glycol) (meth)acrylates, poly (propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth) acrylates, poly(propylene/ethylene glycol) alkyl ether (meth) acrylates and mixtures thereof. Such monomers typically have a degree of polymerization of from 1 to 50, and typically from 2 to 50.

In another embodiment, the present polymers may contain as polymerized units one or more silicon-containing monomers containing one or more ethylenically unsaturated groups. Exemplary silicon-containing monomers include those of the formula $R_{1-4}SiY_{3-1}$, where each R is independently chosen from vinyl and allyl; and each Y is independently chosen from hydrogen, ($C_1$-$C_6$)alkyl, ($C_1$-$C_6$)alkoxy, and phenyl. It will be appreciated by those skilled in the art that the vinyl or allyl groups may also be bonded to another group, such as (meth)acrylate.

The polymers of the present invention are cross-linked. Any amount of cross-linker is suitable for use in the present invention. Typically, the present polymers contain at least 1% by weight of cross-linker, based on the weight of the polymer. Up to and including 100% cross-linking agent, based on the weight of the polymer, may be effectively used in the polymers of the present invention. In one embodiment, the cross-linked polymer may include only cross-linking monomers as the polymerized units, or may include one or more other monomers. For example, a cross-linked polymer including trimethylolpropane triacrylate and trimethylolpropane trimethacrylate is useful.

A wide variety of cross-linking agents may be used in the present invention. Suitable cross-linkers include, but are not limited to, di-, tri-, tetra-ethylenically or acetylenically unsaturated, or higher multi-functional ethylenically or acetylenically unsaturated monomers, and more typically multifunctional (meth)acrylate monomers. Exemplary cross-linkers include, without limitation, trivinylbenzene, divinyltoluene, divinylpyridine, divinylnaphthalene, divinylxylene, ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propyleneglycol dimethacrylate, propyleneglycol diacrylate, trimethylolpropane trimethacrylate, divinyl benzene, glycidyl methacrylate, 1,3-butylene glycol diacrylate, 1,3-butylene glycol dimethacrylate, 1,4-butanediol diacrylate, diethylene glycol diacrylate, 1,6-hexanediol diacrylate, 1,6-hexanediol dimethacrylate, tripropylene glycol diacrylate, triethylene glycol dimethacrylate, tetraethylene glycol diacrylate, tetraethylene glycol dimethacrylate, polyethylene glycol dimethacrylate, ethoxylated bisphenol A diacrylate, ethoxylated bisphenol A dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, 1,4-benzenediol diacrylate, 1,4-benzenediol dimethacrylate, bis-(acryloxyethyl)phosphate, bisphenol-A diacrylate, bisphenol-A dimethacrylate, 1,4-butanediol diacrylate, 1,4-butanediol dimethacrylate, 2-butene-1,4-diol diacrylate, 2-butene-1,4-diol dimethacrylate, butylene glycol dimethacrylate, 1,2,4-butanetriol trimethacrylate, crotyl acrylate, crotyl methacrylate, 1,4-cyclohexanediol diacrylate, 1,4-cyclohexanediol dimethacrylate, decamethylene glycol diacrylate, decamethylene glycol dimethacrylate, diallyl isocyanurate, diallyl itaconate, di-(3-acryloxyethyl) ether of bisphenol-A, di-(acryloxy-2-hydroxypropyl) ether of bisphenol-A, diallyl fumarate, diisoproprenylbenzene, di-(3-methacryloxyethyl) ether of bisphenol-A, di-(3-methacryloxy-2-hydroxypropyl) ether of bisphenol-A, di-(3-methacryloxy-2-hydroxypropyl) ether of tetrachlorobisphenol-A, di-(3-methacryloxy-2-hydroxypropyl) ether of tetrahromobisphenol-A, di-(3-methacryloxy-2-hydroxypropyl) ether of 1,4-butanediol, di-(3-methacryloxy-2-hydroxypropyl) ether of diphenolic acid, 2,2-dimethyl-1,3-propanediol diacrylate; 2,2-dimethyl-1,3-propanediol dimethacrylate, dipropylene glycol dimethacrylate, gycerol triacrylate, gycerol trimethacrylate, hexamethylene glycol diacrylate, hexamethylene glycol dimethacrylate, hydrogenated bisphenol-A dimethacrylate, melamine acrylate, N,N'-methylenebisacrylamide, 1,9-nonanediol dimethacrylate, 1,5-pentanediol diacrylate, 1,5-pentanediol dimethacrylate, pentaerythritol trimethacrylate, 1-phenyl-1,2-ethanediol dimethacrylate, polyoxyethyl-2,2-di(p-hydroxyphenyl)propane diacrylate, polyoxyethyl-2,2-di(p-hydroxyphenyl)propane dimethacrylate, polyoxypropyltrimethylolpropane triacrylate, 1,3-propanediol diacrylate, 1,3-propanediol dimethacrylate, propoxylated bisphenol-A dimethacrylate, 1,3,5-triacryloylhexahydro-s-trazine, triethylene glycol diacrylate, 1,3,5-isopropenylbenzene, trimethylolethane triacrylate, trimethylolpropane diallyl ether mono-methacrylate, 2,2,4-trimethyl-1,3-pentanediol dimethacrylate, tris-(2-acryloxyethyl) isocyanurate, tris-(2-methacryloxyethyl) isocyanurate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane) and mixtures thereof. Other suitable cross-linking agents are well-known to those skilled in the art and may also be used in the present invention.

The polymers useful in the present invention are generally commercially available, such as from the Rohm and Haas Company, Philadelphia, Pa., or may be prepared by any known means such as emulsion, solution or suspension polymerization. For example, see U.S. Pat. No. 6,420,441 B1 (Allen et al.) discloses the preparation of certain cross-linked polymer particles using both emulsion and solution polymerization techniques.

In one embodiment, the polymers useful as sacrificial material in the present invention typically have a weight average molecular weight in the range of approximately 1000 to 10,000,000, more typically 100,000 to 5,000,000, and still more typically 100,000 to 1,000,000. When cross-linked polymer particles are used, such polymer particles typically have a mean particle size up to 1,000 nm, such as in the range of 1 to 1000 nm. More typically, the mean particle size is in the range of 1 to 200 nm, still more typically from 1 to 50 nm, and most typically 1 to 20 nm. The particle size polydispersity of these polymer particles is from 1.0001 to 10, more preferably from 1.001 to 5, and most preferably from 1.001 to 2.5.

The sacrificial material is disposed on a substrate to form a sacrificial material film. Such film may be formed by disposing a composition containing a cross-linked polymer on the substrate. Alternatively, such sacrificial material film may be formed by disposing a composition containing one or more cross-linking agents on the substrate, followed by curing the one or more cross-linking agents to form a cross-linked polymer on the substrate. Optionally, such composition containing one or more cross-linking agents may also contain one or more monomers, one or more uncross-linked polymers, one or more cross-linked polymers, or a mixture of any of the foregoing. It is preferred that the sacrificial material film is disposed on the substrate by depositing a film of cross-linked polymer particles, by depositing a composition containing one or more cross-linking agents followed by curing, by depositing a composition containing cross-linked polymer particles and one or more cross-linking agents followed by curing, or by depositing a composition containing an uncross-linked polymer and one or more cross-linking agents followed by curing.

The sacrificial material film may be disposed on the substrate as a dry film, as a melt or as a composition in a solvent. A wide variety of solvents may be used. The choice of solvent will depend on the particular application and the composition of the polymer. Exemplary solvents include, but are not limited to: ketones; lactones; esters; ethers; N-methyl-2-pyrrolidone; N,N'-dimethylpropyleneurea; aromatic solvents; alcohols; hydrocarbons; acids or mixtures thereof. Any suitable means may be used to dispose the sacrificial material melt or composition on the substrate, such as spin coating, dipping, roller coating, and curtain coating.

When a sacrificial material composition is cured on a substrate to form a sacrificial material film, such curing may be by any method that increases the molecular weight of one or more components in the composition. Typically, such method is polymerization. Such polymerization may be by any method such as Diels-Alder, anionic, cationic and, preferably, free-radical polymerization. Polymerization may be initiated thermally, photochemically, or by a combination of the two. Any suitable polymerization catalyst may then be added to the sacrificial material composition, such as thermal acid generators, thermal base generators, photoacid generators, photobase generators, and free-radical initiators. Mixtures of such catalysts may be employed. Suitable photoacid and photobase generators are well-known to those skilled in the art. In one embodiment, the sacrificial material compositions that are to be cured on a substrate contain one or more free-radical polymerization initiators.

Examples of suitable polymerization catalysts, include, but are not limited to, azo compounds, sulfur containing compounds, metallic salts and complexes, oximes, amines, polynuclear compounds, organic carbonyl compounds; quinones; vicinal ketaldonyl alcohols; photoreducible dyes and reducing agents such as dyes of the phenazine, oxazine, and quinone classes; benzophenone, 2,4,5-triphenylimidazolyl dimers with hydrogen donors, and mixtures thereof. Such free-radical generators are particularly suitable for use with negative-acting photoimageable compositions.

Exemplary photoinitiators include: 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoinitiators are disclosed in Nippon Kagaku Kaisha No. 1192-199 (1984) and include 2,4,6,-tris(trichloromethyl)-1, 3,5-triazine with 3,3'-carbonyl bis(7-diethylaminocoumarin), 1-methyl-2-benzylmethylene-1,2-dihydronaphthol (1,2d) thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho (1,2d) thiazole. Preferred photoinitiators are ketones having morpholino and s-phenyl groups. A preferred photoactive component is 2-methyl-1-[4-(methylthio)phenyl]-2-morpholinopropan-1-one.

Mixtures of photoactive components may optionally be used. When two photoactive components are used, they may be used in any ratio, such as from 99:1 to 1:99. Typically, such photoactive components are present in an mount of from 0.05 to 10% wt based on the total weight of the composition.

The sacrificial material of the present invention must be removable from the substrate. A wide variety of conditions may be used to effect such removal, including, without limitation, exposure to heat, pressure, vacuum or radiation such as, but not limited to, actinic, IR, microwave, UV, x-ray, gamma ray, alpha particles, neutron beam, and electron beam, dissolution, chemical etching, and plasma etching. It will be appreciated that more than one method of removing the porogen or polymer may be used, such as a combination of heat and actinic radiation.

An overlayer material is deposited over the sacrificial material film. The overlayer material may be a layer of any material that has sufficient permeability to allow the sacrificial material film to be removed through it. Such overlayer materials may be organic, inorganic or organic-inorganic materials. In one embodiment, the overlayer material is the dielectric material used in the non-air gap regions of the same level. Exemplary overlayer materials include, without limitation: inorganic materials such as carbides, oxides, nitrides and oxyfluorides of silicon, boron, or aluminum; organic polysilica materials; silicones; silicates; silazanes; and organic materials such as benzocyclobutenes, poly(aryl esters), poly (ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles. Suitable overlayer materials are commercially available under the tradenames TEFLON, AVATREL, BCB, AEROGEL, XEROGEL, PARYLENE F, PARYLENE N, and ZIRKON.

"Organic polysilica" material means a compound including silicon, carbon and oxygen. In one embodiment, suitable organic polysilica materials are hydrolyzates or condensates including one or more silanes of formula (I), (II) or both (I) and (II):

$$R_aSiY_{4-a} \tag{I}$$

$$R^1_b(R^2O)_{3-b}Si(R^3)_cSi(OR^4)_{3-d}R^5_d \tag{II}$$

wherein R is selected from hydrogen, $(C_1\text{-}C_8)$alkyl, $(C_7\text{-}C_{12})$arylalkyl, substituted $(C_7\text{-}C_{12})$arylalkyl, aryl, and substituted aryl; Y is any hydrolyzable group; a is an integer of 0 to 2; $R^1$, $R^2$, $R^4$ and $R^5$ are independently selected from hydrogen, $(C_1\text{-}C_6)$alkyl, $(C_7\text{-}C_{12})$arylalkyl, substituted $(C_7\text{-}C_{12})$arylalkyl, aryl, and substituted aryl; $R^3$ is selected from $(C_1\text{-}C_{10})$ alkylene, $-(CH_2)_h-$, $-(CH_2)_{h1}\text{-}E_k\text{-}(CH_2)_{h2}-$, $-(CH_2)_h-Z$, arylene, substituted arylene, and arylene ether; E is selected from oxygen, $NR^6$ and Z; Z is selected from arylene and substituted arylene; $R^6$ is selected from hydrogen, $(C_1\text{-}C_6)$alkyl, aryl and substituted aryl; b and d are independently an integer of 0 to 2; c is an integer of 0 to 6; and h, h1, h2 and k are independently an integer from 1 to 6; provided that at least one of R, $R^1$, $R^3$ and $R^5$ is not hydrogen. "Substituted arylalkyl", "substituted aryl" and "substituted arylene" refer to an arylalkyl, aryl or arylene group having one or more of its hydrogens replaced by another substituent group, such as cyano, hydroxy, mercapto, halo, $(C_1\text{-}C_6)$alkyl, and $(C_1\text{-}C_6)$alkoxy. Typically, R is $(C_1\text{-}C_4)$alkyl, benzyl, hydroxybenzyl, phenethyl or phenyl, and more typically methyl, ethyl, iso-butyl, tert-butyl or phenyl. In one embodiment, a is 1. Suitable hydrolyzable groups for Y include, but are not limited to, halogen, $(C_1\text{-}C_6)$alkoxy, and acyloxy. Preferred hydrolyzable groups are chloro and $(C_1\text{-}C_2)$alkoxy. In another embodiment, c is an integer of 1 to 6 and typically 1 to 4.

Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) typically include those wherein $R^1$ and $R^5$ are independently $(C_1\text{-}C_4)$alkyl, benzyl, hydroxybenzyl, phenethyl or phenyl. More typically, $R^1$ and $R^5$ are methyl, ethyl, tert-butyl, iso-butyl and phenyl. In a further embodiment, b and d are independently 1 or 2. In one embodiment, $R^3$ is selected from $(C_1\text{-}C_{10})$alkylene, $-(CH_2)_h-$, arylene, arylene ether and $-(CH_2)_{h1}\text{-}E\text{-}(CH_2)_{h2}$. Suitable compounds of formula (II) include, but are not limited to, those wherein $R^3$ is methylene, ethylene, propylene, butylene, hexylene, norbornylene, cycloheylene, phenylene, phenylene ether, naphthylene or $-CH_2-C_6H_4-CH_2-$.

Exemplary organosilanes of formula (II) include, without limitation, bis(hexamethoxysilyl)methane, bis(hexaethoxysilyl)methane, bis(hexaphenoxysilyl)methane, bis(dimethoxymethylsilyl)methane, bis(diethoxymethyl-silyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl)ethane, bis(diethoxymethylsilyl)ethane, bis(dimethoxyphenylsilyl)ethane, bis(diethoxyphenyl-silyl)ethane, bis(methoxydimethylsilyl)ethane, bis(ethoxydimethylsilyl)ethane, bis(methoxy-diphenylsilyl)ethane, bis(ethoxydiphenylsilyl)ethane, 1,3-bis(hexamethoxysilyl))propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane. Preferred of these are hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetranethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyl-disilane, bis(hexamethoxysilyl)methane, bis(hexaethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethyl-silyl)methane, bis(methoxydiphenylsilyl)methane, and bis(ethoxydiphenylsilyl)methane.

When the organic polysilica materials include only a hydrolyzate or condensate of organosilanes of formula (II), c may be 0, provided that at least one of $R^1$ and $R^5$ are not hydrogen. In an alternate embodiment, the organic polysilica materials may comprise a cohydrolyzate or cocondensate of organosilanes of h formulae (I) and (II). In such cohydrolyzates or cocondensates, c in formula (II) can be 0, provided that at least one of R, $R^1$ and $R^5$ is not hydrogen. Suitable silanes of formula (II) where c is 0 include, without limitation, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

In one embodiment, particularly suitable organic polysilica materials are hydrolyzates or condensates of one or more compounds of formula (I). Such organic polysilica materials have the formula (III):

$$((R^7R^8SiO)_e(R^9SiO_{1.5})_f(R^{10}SiO_{1.5})_g(SiO_2)_r)_n \tag{III}$$

wherein $R^7$, $R^8$, $R^9$ and $R^{10}$ are independently selected from hydrogen, $(C_1\text{-}C_6)$alkyl, $(C_7\text{-}C_{12})$arylalkyl, substituted $(C_7\text{-}C_{12})$arylalkyl, aryl, and substituted aryl; e, g and r are independently a number from 0 to 1; f is a number from 0.2 to 1; n is integer from 3 to 10,000; provided that e+f+g+r=1; and provided that at least one of $R^7$, $R^8$ and $R^9$ is not hydrogen. In the above formula (III), e, f, g and r represent the mole ratios of each component. Such mole ratios can be varied between 0 and 1. It is preferred that e is from 0 to 0.8. It is also preferred that g is from 0 to 0.8. It is further preferred that r is from 0 to 0.8. In the above formula, n refers to the number of repeat units in the B-staged material. Preferably, n is an integer from 3 to 1000.

Suitable organic polysilica materials include, but are not limited to, silsesquioxanes, condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, and butyl silsesquioxane; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. Silsesquioxane materials include homopolymers of silsesquioxanes, copolymers of silsesquioxanes or mixtures thereof. Such materials are generally commercially available or may be prepared by known methods.

In an alternate embodiment, the organic polysilica materials may contain a wide variety of other monomers in addition to the silicon-containing monomers described above. For example, the organic polysilica resins may further comprise cross-linking agents, and carbosilane moieties. Such cross-linking agents may be any of the cross-linking agents described elsewhere in this specification, or any other known cross-linkers for silicon-containing materials. It will be appreciated by those skilled in the art that a combination of cross-linkers may be used. Carbosilane moieties refer to moieties having a $(Si-C)_x$ structure, such as $(Si-A)_x$ structures wherein A is a substituted or unsubstituted alkylene or arylene, such as $SiR_3CH_2-$, $-SiR_2CH_2-$, $=SiRCH_2-$, and $=SiCH_2-$, where R is usually hydrogen but may be any organic or inorganic radical. Suitable inorganic radicals include organosilicon, siloxyl, or silanyl moieties. These carbosilane moieties are typically connected "head-to-tail", i.e. having Si—C—Si bonds, in such a manner that a complex, branched structure results. Particularly useful carbosilane moieties are those having the repeat units $(SiH_xCH_2)$ and $(SiH_{y-1}(CH=CH_2)CH_2)$, where x=0 to 3 and y=1 to 3. These repeat units may be present in the organic polysilica resins in any number from 1 to 100,000, and preferably from 1 to 10,000.

In one embodiment, organic polysilica material includes a silsesquioxane, and typically methyl silsesquioxane, ethyl silsesquioxane, propyl silsesquioxane, iso-butyl silsesquioxane, tert-butyl silsesquioxane, phenyl silsesquioxane, tolyl silsesquioxane, benzyl silsesquioxane or mixtures thereof. Methyl silsesquioxane, phenyl silsesquioxane and mixtures thereof are particularly suitable. Other useful silsesquioxane mixtures include mixtures of hydrido silsesquioxanes with alkyl, aryl or alkyl/aryl silsesquioxanes. Typically, the silsesquioxanes useful in the present invention are used as oligomeric materials, generally having from 3 to 10,000 repeating units.

Other suitable organic polysilica materials are co-hydrolyzates or condensates of one or more organosilanes of formulae (I) and/or (II) and one or more tetrafunctional silanes having the formula $SiY_4$, where Y is any hydrolyzable group as defined above. Suitable hydrolyzable groups include, but are not limited to, halogen, $(C_1-C_6)$alkoxy, and acyloxy. Preferred hydrolyzable groups are chloro and $(C_1-C_2)$alkoxy. Suitable tetrafunctional silanes of the formula $SiY_4$ include, but are not limited to, tetramethoxysilane, tetraethoxysilane, and tetrachlorosilane. Particularly suitable silane mixtures for preparing the cohydrolyzates or cocondensates include: methyl triethoxysilane and tetraethoxysilane; methyl trimethoxysilane and tetramethoxysilane; phenyl triethoxysilane and tetraethoxysilane; methyl triethoxysilane and phenyl triethoxysilane and tetraethoxysilane; ethyl triethoxysilane and tetramethoxysilane; and ethyl triethoxysilane and tetraethoxysilane. The ratio of such organosilanes to tetrafunctional silanes is typically from 99:1 to 1:99, preferably from 95:5 to 5:95, more preferably from 90:10 to 10:90, and still more preferably from 80:20 to 20:80.

In a particular embodiment, the organic polysilica material is a co-hydrolyzate or co-condensate of one or more organosilanes of formula (I) and a tetrafunctional silane of formula $SiY_4$. In another embodiment, the organic polysilica material is a co-hydrolyzate or partial co-condensate of one or more organosilanes of formula (II) and a tetrafunctional silane of formula $SiY_4$. In still another embodiment, the organic polysilica material is a co-hydrolyzate or co-condensate of one or more organosilanes of formula (I), one or more silanes of formula (II) and a tetrafunctional silane of formula $SiY_4$. The organic polysilica materials of the present invention include a non-hydrolyzed or non-condensed silane of one or more silanes of formulae (I) or (II) with the hydrolyzate or condensate of one or more silanes of formulae (I) or (II). In a further embodiment, the organic polysilica material includes a silane of formula (II) and a hydrolyzate or condensate of one or more organosilanes of formula (I), and preferably a co-hydrolyzate or co-condensate of one or more organosilanes of formula (I) with a tetrafunctional silane of the formula $SiY_4$ where Y is as defined above. Preferably, such organic polysilica material includes a mixture of one or more silanes of formula (II) and a co-hydrolyzate or co-condensate having the formula $(RSiO_{1.5}) (SiO_2)$ where R is as defined above.

When organosilanes of formula (I) are co-hydrolyzed or co-condensed with a tetrafunctional silane, it is preferred that the organosilane of formula (I) has the formula $RSiY_3$, and preferably is selected from methyl trimethoxysilane, methyl triethoxysilane, ethyl trimethoxysilane, ethyl triethoxysilane, phenyl trimethoxysilane, phenyl triethoxysilane and mixtures thereof. It is also preferred that the tetrafunctional silane is selected from tetramethoxysilane and tetraethoxysilane.

It will be appreciated that a mixture of dielectric materials may be used, such as two or more organic polysilica dielectric materials or a mixture of one or more organic polysilica dielectric materials and one or more other dielectric materials. Other suitable dielectric materials include, without limitation, inorganic materials such as carbides, oxides, nitrides and oxyfluorides of silicon, boron, or aluminum; and organic materials such as benzocyclobutenes, poly(aryl esters), poly (ether ketones), polycarbonates, poly(arylene ethers), polyaromatic hydrocarbons such as polynaphthalene, polyquinoxalines, poly(perfluorinated hydrocarbons) such as poly (tetrafluoroethylene), polyimides, polybenzoxazoles, polycycloolefins such as polynorbornenes, and polydicyclopentadienes. Such dielectric materials are generally commercially available or may be prepared by methods known in the literature. Thus, mixtures of alkyl/aryl silsesquioxanes, hydrido/alkyl silsesquioxanes, and organic polysilica-organic material hybrids may be used.

As described above, the overlayer material should have sufficient permeability to allow the sacrificial material to be removed through it. Such permeability may be inherent in the material used, such as in the case of silica-based xerogels or aerogels, or may be imparted by other means. Suitable means for imparting permeability include the use of "porogens" or pore forming materials. Exemplary porogens include, but are not limited to, removable solvents, removable monomers and removable polymers. See, e.g., U.S. Pat. Nos. 5,700,844, 5,776,990, 5,895,265 (Carter et al.), U.S. Pat. No. 6,271,273 (You et al.), U.S. Pat. No. 6,391,932 (Gore et al.), and U.S. Pat. No. 6,420,441 B1 (Allen et al.) for methods of making porous dielectric materials using porogens. When porogens are used to prepare the porous overlayer materials, they are typically used in an amount of from 1 to 50% wt, and more typically 1 to 20% wt. In general, the level of porosity in a porous film is approximately equivalent to the amount of porogen used to form the porous film. Thus, an overlayer containing 5% wt of porogen will provide an overlayer having approximately 5% porosity after removal of the porogens. Typical conditions for the removal of the porogens from the overlayer include those described above for the removal of the sacrificial material. Thermal removal of the porogens, with or without the use of actinic radiation. is particularly suitable. The porogens may be removed by heating at 150-400° C.

Particularly suitable overlayer materials are porous organic polysilica materials. Typically, such porous organic polysilica overlayer materials are formed by the removal of porogen polymers from the organic polysilica overlayer materials. In forming such porous film, a composition including an organic polysilica dielectric material and polymeric porogens is disposed on the remaining region of sacrificial material, the organic polysilica dielectric material is cured to form a film, and the polymeric porogens are removed from the film to form a porous film. When such a process is used, the porogens used to form the organic polysilica overlayer material must be removed from the organic polysilica materials under the same conditions as those used to remove the sacrificial material or alternatively under conditions which do not remove the sacrificial material. Thus, any porogen may be removed from the organic polysilica overlayer material to form a porous overlayer material simultaneously with the removal of the sacrificial material. Alternatively, any porogen may be removed from the organic polysilica overlayer material to form a porous overlayer material prior to the removal of the sacrificial material.

The overlayer material may be disposed on the sacrificial material by any suitable means, including, without limitation, spin coating, roller coating, curtain coating, chemical vapor deposition, and lamination. Such methods are well-known to those skilled in the art of depositing dielectric materials.

The sacrificial material is removed by subjecting it to conditions which degrade, decompose or otherwise cause the sacrificial material to form volatile fragments or components which can then pass through the permeable overlayer material. In one embodiment, the sacrificial material is removed by heating. Such heating may be in an oxygen containing atmosphere such as air or may be in an inert atmosphere such a nitrogen or argon. In general, the present sacrificial materials are removed upon heating at a temperature in the range of 150° to 400° C., or higher, and typically at 225° to 375° C. In another embodiment, the sacrificial material is removed using a combination of heat and actinic radiation. An advantage of the present invention is that the particular removal temperature of the sacrificial material can be controlled by selection of the monomers used, the cross-linking agents used and by the amount of monomers and cross-linking agents used. Such selection is well within the ability of those skilled in the art.

Typically, the present sacrificial material leaves very little residue behind, such as $\leq 10\%$ wt, preferably $\leq 5\%$ wt and more preferably $\leq 2\%$ wt.

Another embodiment of the present invention is illustrated in FIGS. 2A-2F. Sacrificial material 35, which is photoimageable and negative tone, is disposed on substrate 30 such as by spin-coating and exposed to patterned actinic radiation 1, as shown in FIG. 2A, to provide a first exposed region and a second unexposed region. The first and second regions have different solubility. The unexposed second region is removed thereby exposing areas of substrate 30 and providing sacrificial material region 35a, as shown in FIG. 2B. Next, dielectric material 40 is disposed on the exposed areas of substrate 30. See FIG. 2C. The dielectric material may be disposed on substrate 30 such as by spin-coating. The dielectric material may overcoat sacrificial material region 35a, with such overcoating removed by various processes known to those skilled in the art, such as chemical mechanical planarization.

A hardmask layer 45 is then disposed on the sacrificial material region 35a and on the dielectric material 40, as illustrated in FIG. 2D. The hardmask (alternatively a cap layer or etch stop) may be composed of any suitable material known in the art, such as organic materials, inorganic materials or organic-inorganic hybrid materials. The hardmask will be sufficiently permeable to allow the sacrificial material to be removed through it. Such permeability may be inherent in the hardmask material or may be produced by making the hardmask porous, such as by the use of porogens as described above. In one embodiment, hardmask 45 is an organic polysilica dielectric material. In this embodiment, dielectric material 40 does not need to be, but may be, sufficiently permeable to allow removal of the sacrificial material. Apertures are next formed in the structure, with a plurality of apertures being formed in the sacrificial material region. Other apertures may be formed in the non-sacrificial material region. Such apertures may be formed using conventional lithographic techniques as described above.

Following aperture formation, the apertures may be filled, such as with one or more metal layers such as a barrier layer and an aperture filling metal layer. Barrier layers are typically used to reduce copper migration. Copper, such as electrodeposited copper, is a useful aperture filling metal. The deposition of such barrier layers and electroplated copper layers are well known to those skilled in the art. FIG. 2E shows substrate 30 having a first level containing dielectric material 40 and sacrificial material region 35a and hardmask 45. Metal lines 50 are present in the structure as a densely packed metal line region 60a and as an isolated line region 60b. The sacrificial material 35a is then removed through permeable hardmask 45 to provide air gaps 36 around metal lines 50 in densely packed metal line region 60a, see FIG. 2F. Isolated metal line 50 in region 60b is sufficiently far removed from other metal lines that capacitive coupling is not problematic and therefore air gaps surrounding such isolated lines are not needed, although they could be used.

Figure 3A:
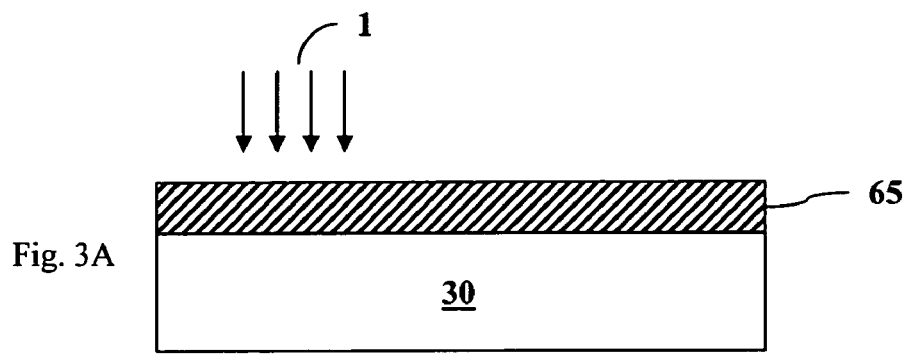
FIGS. 3A-3E illustrate a further embodiment of air gap formation according to the invention.
Figure 3B:
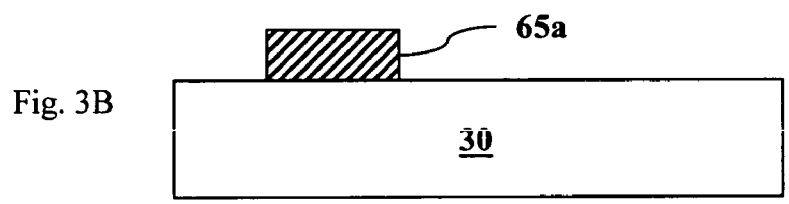
Figure 3C:
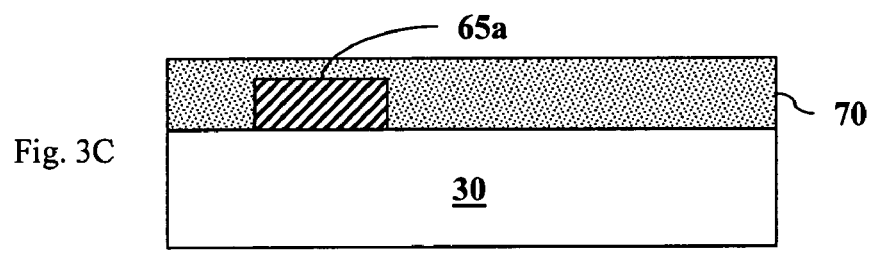
Figure 3D:
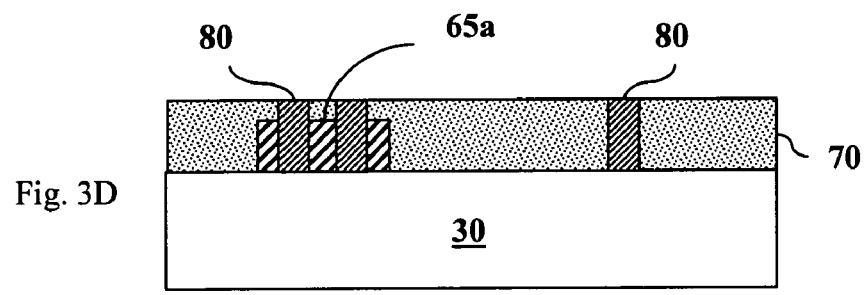
Figure 3E:
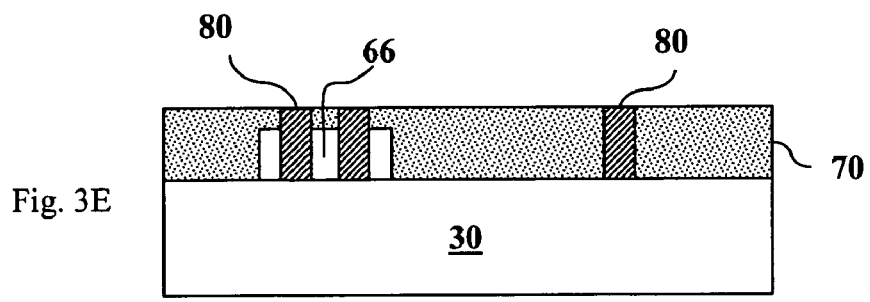

Yet another embodiment of the present invention is illustrated in FIGS. 3A-3E. Sacrificial material 65, which is photoimageable and negative tone, is disposed on substrate 30 such as by spin-coating and exposed to patterned actinic radiation 1, as shown in FIG. 3A, to provide a first exposed region and a second unexposed region. The first and second regions having different solubility. The unexposed second region is removed thereby exposing areas of substrate 30 and providing sacrificial material region 65a, as shown in FIG. 3B. Next, as shown in FIG. 3C, dielectric material 70 is disposed on the exposed areas of substrate 30 and over the sacrificial material region 65a. Apertures are then formed in the substrate using the procedures described above for FIG. 2E. Metal filling of the apertures provides the structure shown in FIG. 3D where a plurality of metal lines 80 are present in sacrificial material region 65a and an isolated metal line 80 is shown in dielectric 70. Following removal of the sacrificial material, air gasp 66 are formed in the region of the plurality of metal lines 80, as shown in FIG. 3E.

Figure 4A:
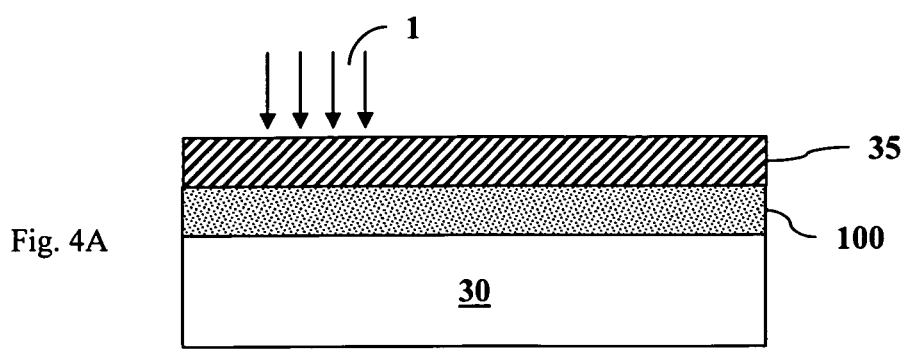
FIGS. 4A-4E illustrate yet another embodiment of air gap formation according to the invention.
Figure 4B:
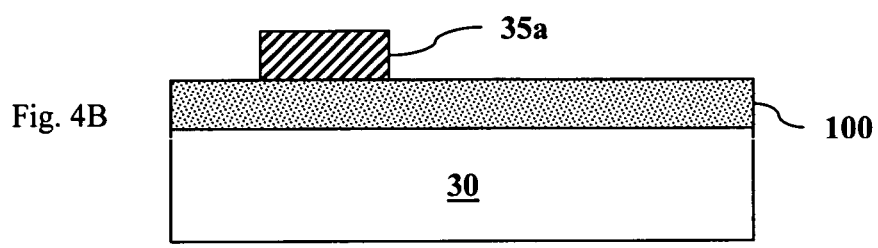
Figure 4C:
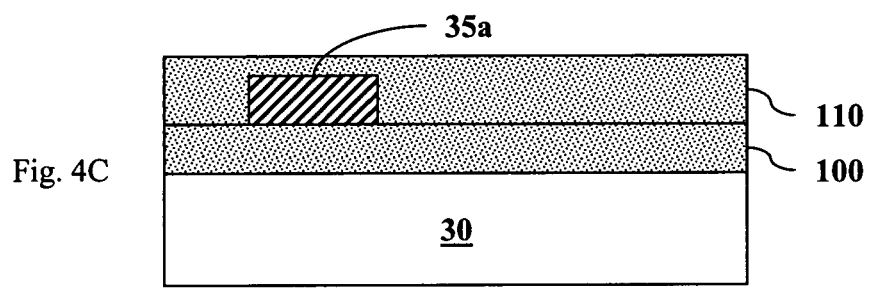
Figure 4D:
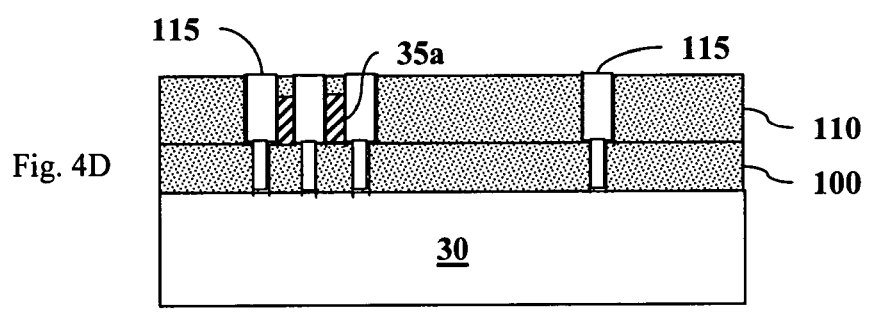
Figure 4E:
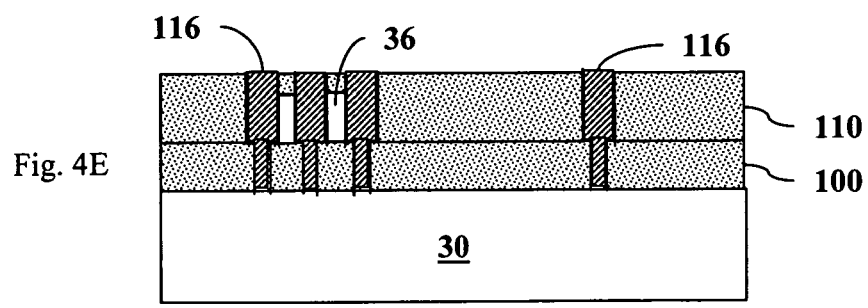

FIG. 4A illustrates sacrificial material 35 disposed on a first dielectric material 100 which is disposed on substrate 30. Sacrificial material 35 is photodefined using patterned actinic radiation 1 to provide a first exposed region and a second unexposed region. The first and second regions have different solubility. The unexposed second region is removed such as by development or contact with a suitable solvent thereby exposing areas of first dielectric material 100 and providing sacrificial material region 35a, as shown in FIG. 4B. Next, as shown in FIG. 4C, second dielectric material 110 is disposed on the exposed areas of first dielectric material 100 and over the sacrificial material region 35a. Second dielectric material 110 may be the same material as the first dielectric material 100 or it may be a different dielectric material. Referring to FIG. 4D, apertures 115 are then formed in second dielectric material 110, in the sacrificial material region 35a and in first dielectric material 100 using the procedures described above for FIG. 2E. The apertures 115 are then filled with metal to provide metal lines 116 and the sacrificial material 35a is removed to provide air gaps 36 in the region of densely packed metal lines 116.

Figure 5A:
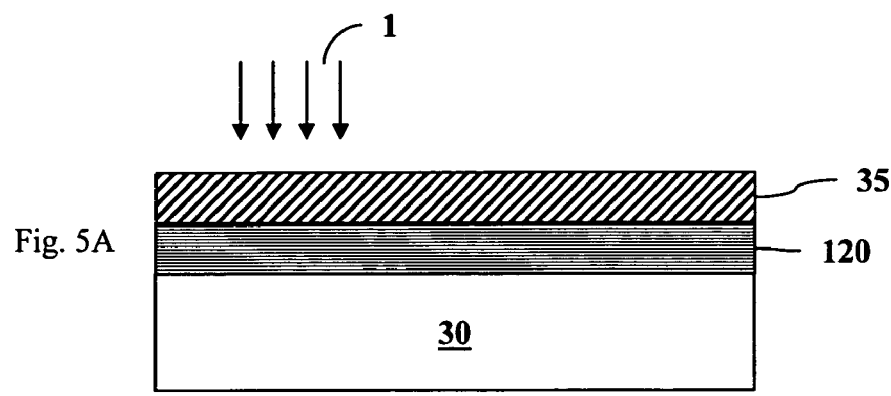
FIGS. 5A-5E illustrate a still further embodiment of air gap formation according to the invention.
Figure 5B:
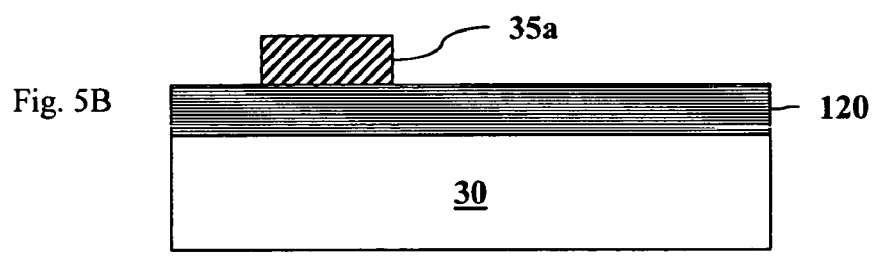

FIG. 5A illustrates yet another embodiment of the invention where sacrificial material 35 is disposed on a first dielectric material 120 which is disposed on substrate 30. Sacrificial material 35 is photodefined using patterned actinic radiation 1 to provide a first exposed region and a second unexposed region. The first and second regions having different solubility. The unexposed second region is removed such as by development or contact with a suitable solvent thereby exposing areas of first dielectric material 120 and providing sacrificial material region 35a, as shown in FIG. 5B.

Figure 5C:
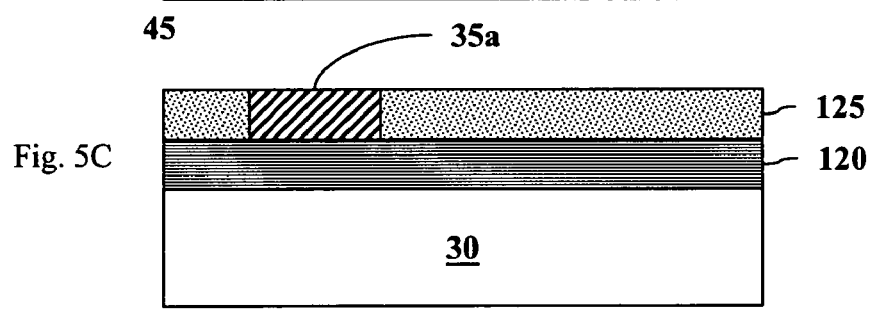

Referring to FIG. 5C, second dielectric material 125 is disposed on the exposed areas of first dielectric material 120. Second dielectric material 125 may be the same as first dielectric material 120 or it may be different than the first dielectric material. The second dielectric material may overcoat sacrificial material region 35a, with such overcoating removed by various processes known to those skilled in the art, such as chemical mechanical planarization. A hardmask layer 130 is then disposed on the sacrificial material region 35a and on the second dielectric material 125. The hardmask (cap layer or etch stop) may be composed of any suitable material known in the art, such as organic materials, inorganic materials or organic-inorganic hybrid materials. The hardmask will be sufficiently permeable to allow the sacrificial material to be removed through it. In this embodiment, first dielectric material 120 and second dielectric material 125 do not need to be, but may be, sufficiently permeable to allow removal of the sacrificial material.

Figure 5D:
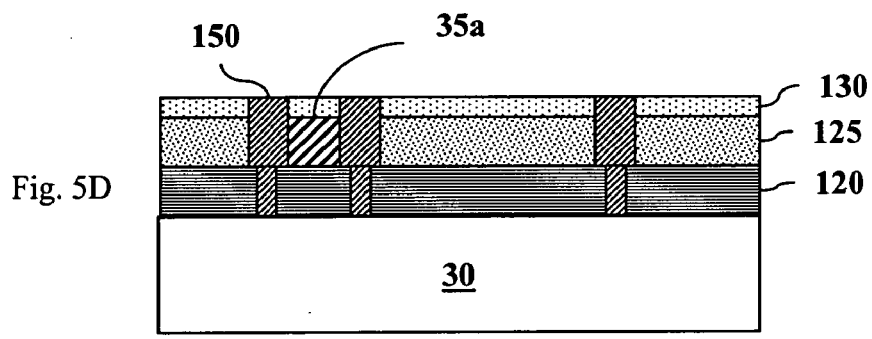
Figure 5E:
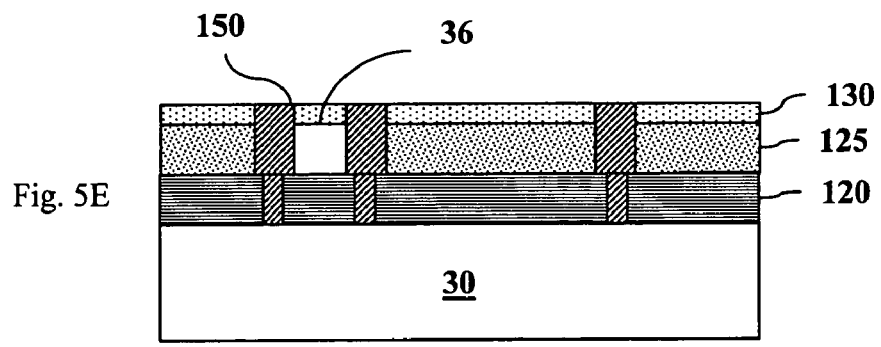

Apertures are next formed in the structure, with a plurality of apertures being formed in the sacrificial material region. Other apertures may be formed in the non-sacrificial material region. Such apertures may be formed using conventional lithographic techniques as described above. Following aperture formation, the apertures may be filled, such as with one or more metal layers such as a barrier layer (not shown) and an aperture filling metal layer 150 such as copper. FIG. 5D shows substrate 30 having a first level containing first dielectric material 120, a second level containing second dielectric material 125 and sacrificial material region 35a and a third level including hardmask 130. Metal lines 150 are present in the structure as a densely packed metal line region in the sacrificial material region 35a and as isolated lines in regions not containing the sacrificial material. The sacrificial material 35a is then removed through permeable hardmask 130 to provide air gaps 36 in the region of densely packed metal lines 150, see FIG. 5E. Isolated metal line 150 in the non-air gap region is sufficiently far removed from other metal lines that capacitive coupling is not problematic and therefore air gaps surrounding such isolated lines are not needed, although they could be used.

Figure 6A:
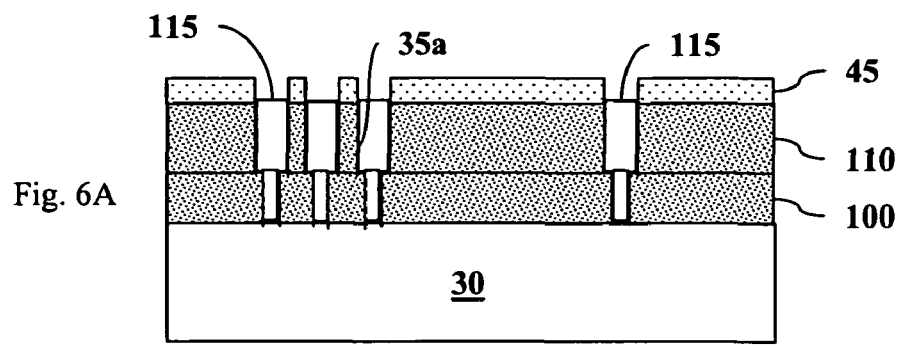
FIGS. 6A-6D illustrate an embodiment of air gap formation in multiple layers according to the invention.
Figure 6B:
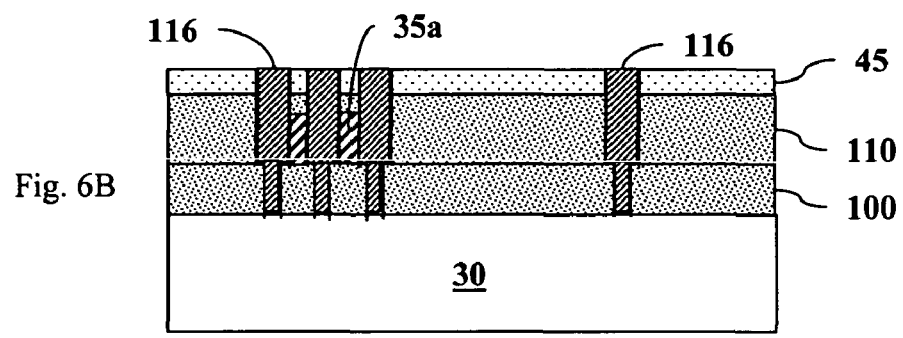
Figure 6C:
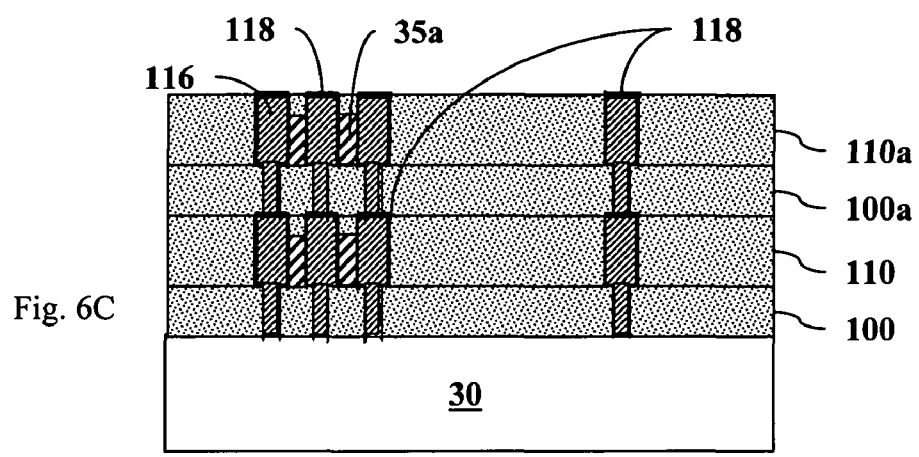

A process for manufacturing a multilayer structure is illustrated in FIGS. 6A-6D. FIG. 6A shows a structure having a substrate 30, a first dielectric material 100, sacrificial material 35a disposed on the first dielectric material 100, a second dielectric material 110 disposed on first dielectric material 100 and sacrificial material 35a, a hardmask layer 45 disposed on second dielectric material 110 and apertures 115. Second dielectric material 110 may be the same as the first dielectric material 100 or it may be a different dielectric material. The structure in FIG. 6A is prepared according to the general process described in FIGS. 5A-5D.

Next, the apertures 115 are filled with a vapor deposited barrier layer (not shown) to reduce copper migration and an aperture filling copper layer (metal line) 116. See FIG. 6B. Hardmask layer 45 is next removed, such as by chemical mechanical planarization. The top surface of metal line 116 is capped with a copper barrier 118. Suitable copper barriers for capping are self-aligned copper barrier layers which include electrolessly deposited metals and metal alloys, such as cobalt-tungsten-phosphide and nickel-tungsten-phosphide. Silicon carbide is another suitable copper barrier. A third dielectric layer 100a is then disposed on the second dielectric layer 110. A sacrificial material region 35a is formed on the third dielectric material 100a and a fourth dielectric layer 110a is disposed on third dielectric layer 100a and on sacrificial material region 35a. Optionally, a hardmask layer (not shown) is disposed on the fourth dielectric layer. Apertures are formed in the third dielectric material layer 100a, in the sacrificial material region 35a and in the fourth dielectric material layer 110a using the methods described above The apertures are filled with an optional barrier layer (not shown) and with copper to form metal line 116. The copper metal line is capped with a suitable copper barrier 118. See FIG. 6C. Optionally, this sequence of steps is repeated to add additional layers of metal lines.

Figure 6D:
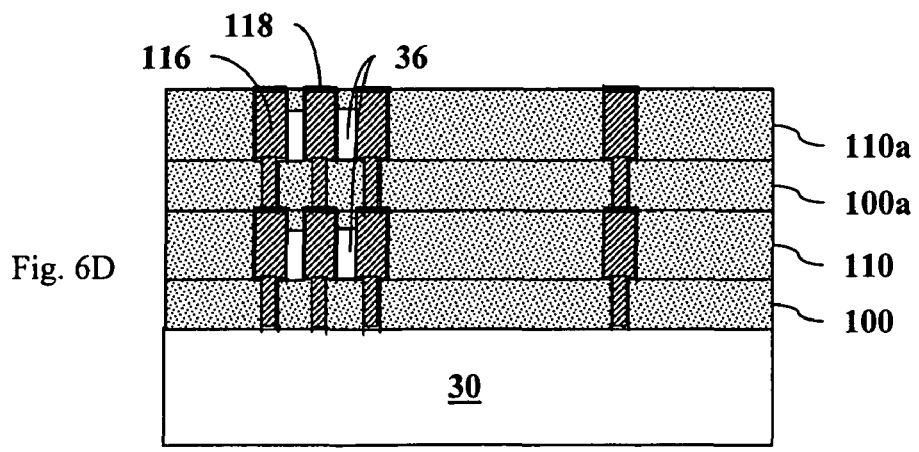

Next, the sacrificial material 35a is removed using heat, light, a combination of heat and light, or another suitable method to form air gaps 36, as shown in FIG. 6D. In this process, dielectric layers 110, 100a and 110a are sufficiently permeable to allow removal of sacrificial material 35a through these dielectric layers. Dielectric layers 100, 110, 100a, and 110a may be composed of the same dielectric material or may contain a different dielectric material. In one embodiment, at least one dielectric layer includes an organic polysilica dielectric material. In another embodiment, dielectric layers 100, 110, 100a and 110a are porous organic polysilica dielectric materials.

The present invention is advantageous in the manufacture of electronic devices having air gaps in regions having a dense packing of metal lines. "Dense packing" refers to a plurality of metal lines in close proximity. In particular, the present invention is advantageous where three or more metal lines are in close proximity. By "close proximity" it is meant that 2 or more metal lines, each having a width "w", are separated by a distance of $0.8 (w) \leq w \leq 2.5 (w)$. The present invention is particularly suited to forming air gaps in trench layers in a dual damascene structure, but may also be used in via layers in such structures. The present invention may also be used in single damascene structures as well as other optoelectronic and optical structures including, without limitation, waveguides, and optical interconnects.

What is claimed is:

1. A method of forming an air gap in an electronic device comprising the steps of: a) disposing a layer of a sacrificial material on a substrate, wherein the sacrificial material is photodefineable; b) photodefining the sacrificial material to provide a first region and a second region, the regions having different solubility; c) removing one of the first and second regions to expose areas of the substrate; d) disposing an overlayer material on the remaining region of sacrificial material; and then e) removing the remaining region of sacrificial material through the overlayer material to form an air gap region; wherein the sacrificial material prior to photodefining comprises a cross-linked polymer.

2. The method of claim 1 wherein the overlayer material is disposed on the exposed areas of the substrate.

3. The method of claim 1 wherein the overlayer material comprises a porous organic polysilica material.

4. The method of claim 1 wherein step d) comprises the steps of: d1) disposing a composition comprising an organic polysilica dielectric material and polymeric porogens on the remaining region of sacrificial material, d2) curing the organic polysilica dielectric material to form a film; and d3) removing the polymeric porogens from the film to form a porous film.

5. The method of claim 1 further comprising the steps of: 1) patterning the overlayer material and the sacrificial material to form an aperture; and 2) depositing a conductive material in the aperture, prior to step e).

* * * * *